United States Patent
Nouri et al.

(10) Patent No.: US 7,795,124 B2
(45) Date of Patent: Sep. 14, 2010

(54) METHODS FOR CONTACT RESISTANCE REDUCTION OF ADVANCED CMOS DEVICES

(75) Inventors: Faran Nouri, Los Altos, CA (US);
Eun-Ha Kim, Menlo Park, CA (US);
Sunderraj Thirupapuliyur, Sunnyvale, CA (US); Vijay Parihar, Fremont, CA (US)

(73) Assignee: Applied Materials, Inc., Santa Clara, CA (US)

(\*) Notice: Subject to any disclaimer, the term of this patent is extended or adjusted under 35 U.S.C. 154(b) by 289 days.

(21) Appl. No.: 11/426,135

(22) Filed: Jun. 23, 2006

(65) Prior Publication Data

US 2007/0298575 A1   Dec. 27, 2007

(51) Int. Cl.
*H01L 21/3205* (2006.01)
*H01L 21/4763* (2006.01)

(52) U.S. Cl. .................. 438/592; 257/388; 257/412; 257/E29.161; 257/E29.156

(58) Field of Classification Search .............. 438/143, 438/581–583, 630, 649, 651, 655, 664, 682, 438/721, 755, 592; 257/388, 412, 455, 456, 257/576, 757, 768–770, E29.156, E29.161, 257/E23.157, E21.593, E21.619
See application file for complete search history.

(56) References Cited

U.S. PATENT DOCUMENTS

| | | | |
|---|---|---|---|
| 4,589,193 A | 5/1986 | Goth et al. | |
| 4,622,735 A * | 11/1986 | Shibata | 438/143 |
| 5,401,666 A * | 3/1995 | Tsukamoto | 438/305 |
| 5,569,624 A * | 10/1996 | Weiner | 438/285 |
| 5,888,888 A | 3/1999 | Talwar et al. | |
| 6,420,264 B1 * | 7/2002 | Talwar et al. | 438/682 |
| 6,599,819 B1 | 7/2003 | Goto | |
| 6,825,115 B1 | 11/2004 | Xiang et al. | |
| 6,867,130 B1 | 3/2005 | Karlsson et al. | |
| 8,897,118 | 5/2005 | Poon et al. | |
| 2001/0012693 A1 * | 8/2001 | Talwar et al. | 438/682 |
| 2005/0074956 A1 | 4/2005 | Autryve et al. | |
| 2005/0186765 A1 | 8/2005 | Ma et al. | |
| 2006/0079086 A1 | 4/2006 | Boit et al. | |
| 2006/0091493 A1 | 5/2006 | Wu | |
| 2006/0105515 A1 | 5/2006 | Amos et al. | |
| 2006/0105557 A1 | 5/2006 | Klee et al. | |
| 2006/0228897 A1 * | 10/2006 | Timans | 438/758 |

OTHER PUBLICATIONS

International Search Report and Written Opinion for PCT/US07/68381, consists of 8 unnumbered pages.

(Continued)

*Primary Examiner*—Davienne Monbleau
*Assistant Examiner*—Monica D Harrison
(74) *Attorney, Agent, or Firm*—Patterson & Sheridan, LLP

(57) ABSTRACT

Methods for reducing contact resistance in semiconductor devices are provided in the present invention. In one embodiment, the method includes providing a substrate having semiconductor device formed thereon, wherein the device has source and drain regions and a gate structure formed therein, performing a silicidation process on the substrate by a thermal annealing process, and performing a laser anneal process on the substrate. In another embodiment, the method includes providing a substrate having implanted dopants, performing a silicidation process on the substrate by a thermal annealing process, and activating the dopants by a laser anneal process.

24 Claims, 4 Drawing Sheets

OTHER PUBLICATIONS

M. Muller, et al. "New junction concepts for sub-50 nm CMOS transistors: slim spacers and Ni silicide", IEEE, 2003, pp. 31-34.

C.J. Choi, et al, "Nickel-silicidation process using hydrogen implantation", Electronic Letter, vol. 40, No. 6, Mar. 18, 2004, consists of two unnumbered pages.

Yu-Long Jiang, et al, "Dopant Redistribution Induced by Ni Silicidation at 300C", IEEE, 2004, pp. 139-142.

M. H. Juang, et al, "Various Effects of Silicidation on Shallow p/n Junctions Formed by BF Implantation into Thin Poly-Si Films on Si Substrates" IEEE Electron Device Letters, vol. 20, No. 7, Jul. 1999, pp. 348-350.

* cited by examiner

METHODS FOR CONTACT RESISTANCE REDUCTION OF ADVANCED CMOS DEVICES

BACKGROUND OF THE INVENTION

1. Field of the Invention

Embodiments of the invention generally relate to the field of semiconductor manufacturing processes, more particular, to methods for dopant activation within silicon-containing films forming semiconductor devices.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. The transistors can include semiconductor gates disposed between source and drain regions. In the formation of integrated circuit structures, and particularly in the formation of MOS devices using polysilicon gate electrodes, it has become the practice to provide a metal silicide layer over the polysilicon gate electrode and over the source and drain regions of the silicon substrate to facilitate lower resistance and improve device performance by electrically connecting the source and drain regions to metal interconnects. In a silicidation process, the source, drain and polysilicon gate resistances are reduced by forming a highly conductive overlayer and reducing the contact resistance by increasing the effective contact area of the source and drain with the subsequently formed metal interconnects.

Typically, after dopants have been implanted into the source and drain regions, a thermal activation process is performed prior to the silicidation process. The thermal activation process provides thermal energy sufficient to activate the implanted dopants and enable a defined source/drain junction to be formed. The increase of active dopants in the active regions improves device performance while insufficient activation of the dopants may result in high series resistance and low device speed. Conventional thermal activation processes are performed by a rapid thermal processing (RTP) and/or spike annealing. Recently, laser annealing has been developed to meet the high dopant activation requirements of 65 nm features.

However, during formation of the metal silicide layer, the agglomeration and irregular growth of the metal silicide layer may cause dopants to be segregated and accumulated on the silicon side of the interface of the silicon and silicide layer, resulting in so-called "snow-plow effect". The dopant migration in the source/drain regions may influence the crystallinity in the active regions and contribute a modification of the interface dipole. The modification of the interface dipole in the interface area resulting from the snow-plow effect may adversely affect the electrical performance, such as working function shift, of the semiconductor devices and result in a retardation of silicidation kinetic. The non-uniform dopant concentration at the interface area may also increase contact resistance, thereby deteriorating overall device speed and performance.

Therefore, there is a need for an improved method for fabricating CMOS devices.

SUMMARY OF THE INVENTION

Methods for reducing contact resistance in semiconductor devices are provided in the present invention. In one embodiment, a method for reducing contact resistance includes providing a substrate having implanted dopants, performing a silicidation process on the substrate by a thermal annealing process, and activating the dopants by a laser anneal process performed on the thermally annealed substrate.

In another embodiment, the method for reducing contact resistance includes providing a substrate having a semiconductor device formed thereon, wherein the device has source and drain regions and a gate structure, performing a silicidation process on the substrate by a thermal annealing process, and performing a laser anneal process on the thermally annealed substrate.

In yet another embodiment, the method for reducing contact resistance includes providing a substrate having a semiconductor device formed thereon, wherein the device has source and drain regions and a gate structure, depositing a metal layer on the device, performing a silicidation process to form a silicide layer on the substrate by a thermal annealing process, and performing a laser anneal process on the thermally annealed substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

The present invention provides methods for reducing contact resistance in source/drain regions of semiconductor devices that have been thermally treated after dopant implantation. The contact resistance is reduced by a laser annealing process performed after a silicidation process. The laser annealing process performed after the silicidation process efficiently activates dopants accumulated on the interface of the silicon and silicide layer of source/drain junction during the silicidation process. The laser anneal activation process reactivates the dopants accumulated at the interface area of the silicon and silicide layer and redistributes dopants into lattice sites of the silicon layer that increases the overall dopant concentration in the source/drain regions after the silicidation process, thereby reducing contact resistance and improving device performance.

Figure 1:
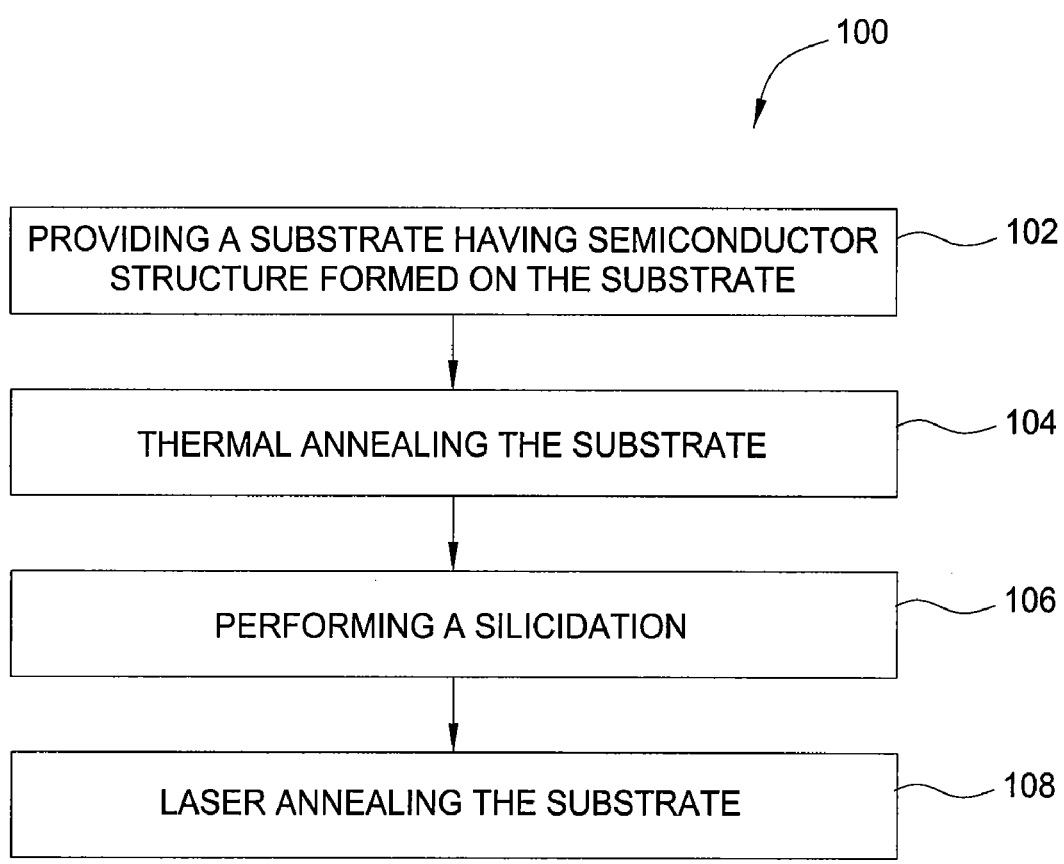
FIG. 1 depicts a process diagram illustrating a method for reducing contact resistance according to one embodiment of the present invention.
Figure 2A:
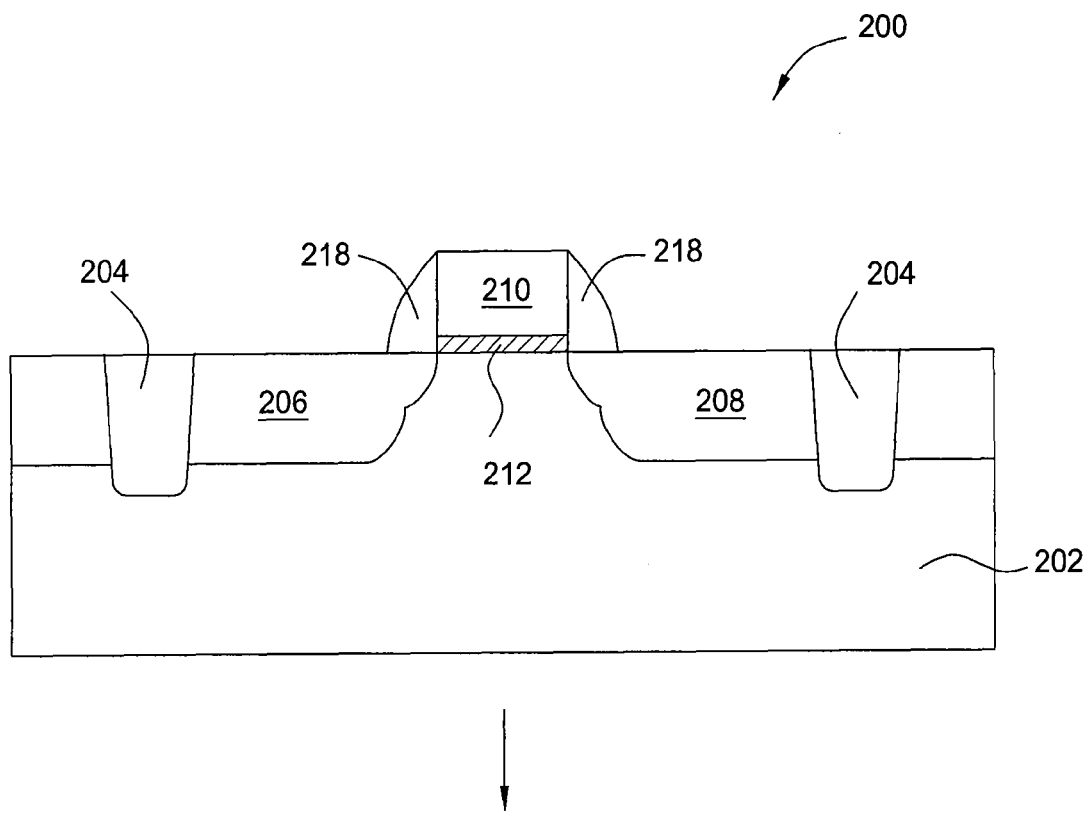
FIGS. 2A-2C depicts cross sectional views of a semiconductor devices formed on a substrate at different stages of the method as described in FIG. 1.
Figure 2B:
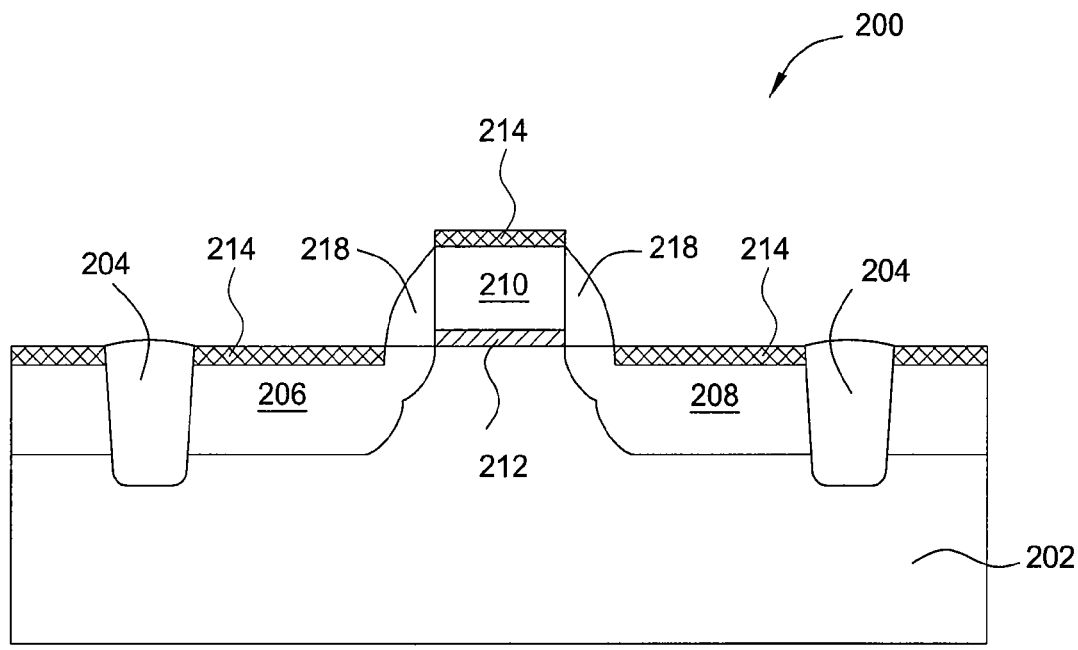
Figure 2C:
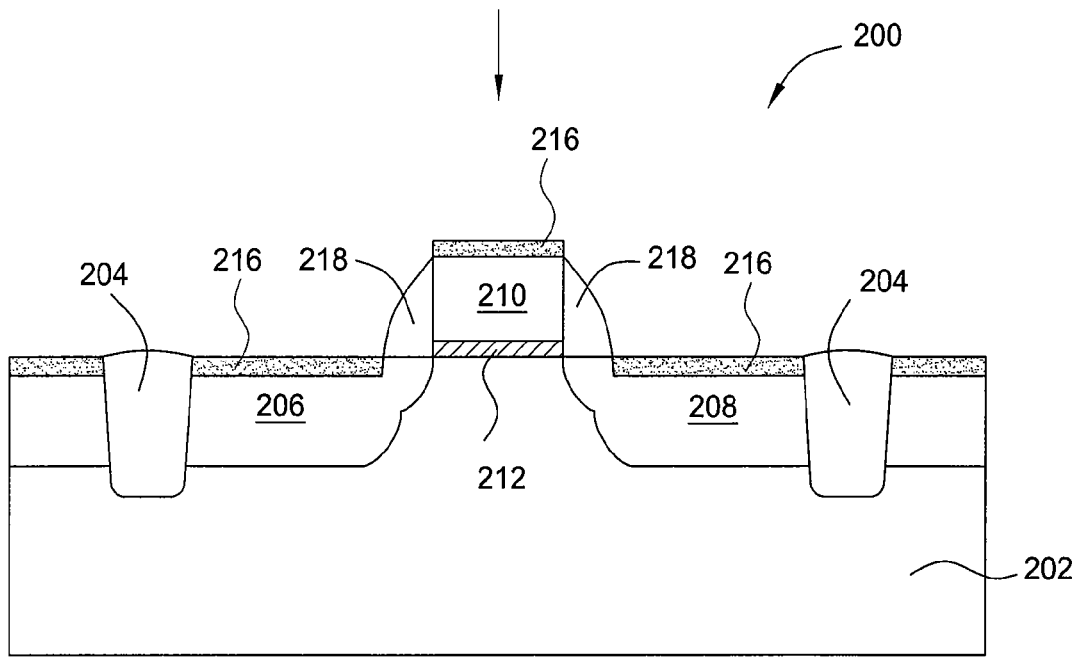

FIG. 1 illustrates a process flow diagram of one embodiment of a method 100 for laser annealing a substrate having a semiconductor device formed thereon. FIGS. 2A-C are schematic cross-sectional views illustrating a substrate having a semiconductor device formed thereon during different stages of the method 100.

Referring to FIGS. 1-2C, the method 100 begins at step 102 by providing a substrate 202 having at least one semiconductor device 200 formed thereon. Shallow trench isolations (STI) 204 are present to isolate each semiconductor device 200 formed on the substrate 202. One device 200 and two STI's 204 are shown in FIG. 2A. In one embodiment, the substrate 202 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), doped silicon, germanium, gallium arsenide, glass, and sapphire. The substrate 202 may have various dimensions, such as 200 mm or 300 mm diameter wafers, as well as, rectangular or square panes. Unless otherwise noted, embodiments and examples described herein are conducted on substrates with a 200 mm diameter or a 300 mm diameter.

A polysilicon gate electrode 210 is formed on a gate dielectric layer 212 disposed on the substrate 202. Dielectric sidewall spacers 218 are disposed on the side surfaces of the gate electrode 210 and gate dielectric layer 212. Source 206 and drain 208 regions are formed by ion implantation below and adjacent the dielectric sidewall spacers 218 in the substrate 202.

In one embodiment, elemental dopants implanted into the source 206 and drain 208 regions may include boron, arsenic, phosphorus, gallium, antimony, indium or combinations thereof. Elemental dopants may have a concentration in the source 206 and drain 208 regions from about $1 \times 10^{19}$ atoms/$cm^3$ to about $1 \times 10^{21}$ atoms/$cm^3$. The ion implantation apparatus may be used to provide ion implantation process may be performed at a low implantation energy of about 5 KeV or less, such as about 3 KeV or less. Examples of the ion implantation apparatus include Quantum III® system and Implant xR LEAP® system, both available from Applied Materials Inc., Santa Clara, Calif. For example, boron is implanted with energy of about 3 KeV and a dose from about $1 \times 10^{15}$ atoms/$cm^2$ to about $1 \times 10^{14}$ atoms/$cm^2$. In one example, the boron is implanted at about $4 \times 10^{15}$ atoms/$cm^2$. In another example, boron is implanted at about $8 \times 10^{15}$ atoms/$cm^2$. More details of the dopants implanted by the ion implantation process are described in commonly assigned, U.S. Pat. No. 6,583,018, which is incorporated herein by reference.

At step 104, an optional thermal annealing process is performed on the substrate 202 to activate the dopants implanted on the source 206 and drain regions 208 in the substrate 202. In one embodiment, the thermal annealing process may be performed by a conventional RTP process. In one embodiment, the thermal annealing process is performed by a rapid thermal annealing (RTA) processing between about 2 second and 50 seconds and maintaining substrate temperature at between about 800 degrees Celsius and about 1200 degrees Celsius. It is noted that annealing process, including process time and temperature, may be varied based on different elemental dopants and dopant concentrations in the devices. An example of a suitable RTP chamber is the CENTURA™ RADIANCE™ RTP chamber, available from Applied Materials, Inc., Santa Clara, Calif. Other annealing chambers, including those from other manufacturers, may be utilized to perform the thermal anneal process of step 104. Details of thermal activation processes that may be used to practice the invention is described in commonly assigned U.S. Patent Publication No. 2005/0186765 published on Aug. 25, 2005, to Ma, et. al, and is herein incorporated by reference.

In another embodiment, the thermal annealing process may be performed by two step annealing process including a conventional rapid thermal annealing (RTA) processing, such as the RTA processing stated above, and a laser annealing process, such as a dynamic surface annealing (DSA) process. The second step laser annealing process may be performed by scanning the substrate with an energy beam that, for a short duration, heats an incremental portion of the substrate to temperature between about 1000 degrees Celsius and about 1415 degrees Celsius. The portion heated by the energy beam is maintained at the elevated temperature for less than 500 milliseconds, such as less than 100 milliseconds. One suitable chamber for DSA process is the DSA platform, available from Applied Materials, Inc. It is contemplated that other DSA platforms, including those from other manufacturers, may be utilized to perform the laser annealing process.

At step 106, a silicidation process is performed on the substrate by a conventional thermal anneal process. The silicidation process converts a metal layer 214, as shown in FIG. 2B, deposited over a top surface of the gate electrode layer 210 and over selective source 206 and drain regions 208 of the substrate 202 into a metal silicide layer 214, as further shown in FIG. 2C. Suitable examples of the metal layers utilized to form the silicide layer include tungsten (W), titanium (Ti), hafnium (Hf), cobalt (Co), nickel (Ni), alloys thereof, or any combination thereof. The metal layer may be deposited on the substrate by a physical vapor deposition technique (PVD), a CVD technique, an atomic layer deposition technique, or other suitable deposition method. In one embodiment, the metal layer may be deposited is maintained at a temperature between about 10 degrees Celsius and about 600 degrees Celsius during the deposition process, such as 250 degrees Celsius and 450 degrees Celsius by a PVD, CVD or an ALD process. It is noted that metal layers deposited over other portions of the substrate 202, e.g., STI 204 or dielectric sidewall spacers 218, may be removed by conventional etching steps after silicidation process utilized in the semiconductor devices manufacture.

The magnitude of snow-plow effect, e.g., amounts of dopants displaced and accumulated at the interface area during the silicidation process, is highly related to the silicidation process temperature. The segregation coefficients of the dopants in the silicon and silicide layer is a highly temperature dependent factor so that a higher silicidation process temperature will typically snow-plow more dopants into the interface area. To mitigate the snow-plow effect, a spike or soak RTP process of step 106 may be maintained at a process temperature in a relative low range, such as below 900 degrees Celsius. As the present invention includes a laser annealing step 108 performed after the silicidation process of step 106 to activate the dopants accumulated in the interface area, a higher silicidation process temperature, such as greater than 900 degrees Celsius, may be used, thereby reducing the overall process time and increasing manufacture throughput. In one embodiment, a silicidation process at step 106 may have a temperature range between about 400 degrees Celsius and about 1400 degrees Celsius. In another embodiment, the silicidation process may include a laser annealing process having a process temperature maintained at between about 1100 degrees Celsius and about 1415 degrees Celsius. In yet another embodiment, a multiple step annealing, e.g., two steps or more, including a RTP process and a laser annealing process may be utilized for the silicidation process of step 106.

In one embodiment, the silicidation process at step 106 may be performed by supplying an inert gas into an annealing chamber at a flow rate between about 0 sccm and about 15 sccm, controlling a chamber pressure of about 2 milliTorr or less, maintaining a temeprature range between about 400 degrees Celsius and about 1400 degrees Celsius, and performing the process while rotating the substrate for a time period between about 5 seconds and about 600 seconds to form the metal silicide layer. An example of a suitable RTP chamber, in which step 106 may be performed, is the CENTURA™ RADIANCE™ RTP chamber, available from Applied Materials, Inc.

In another embodiment, the silicidation process of step 106 using a laser scan includes maintaining a substrate temperature of between about 1000 degrees Celsius and about 1415 degrees Celsius and sequentially processing the substrate for less than 500 milliseconds, such as less than 100 milliseconds. One suitable chamber for DSA process is the DSA platform, available from Applied Materials, Inc.

At step 108, a laser anneal process is performed after the silication step 106 to active dopants in the source 206 and drain regions 208 in the devices 200. As the silicilaton process at step 106 may drive dopants in the active regions 206, 208 to pile up in the interface area adjacent the silicide layer 216, the laser anneal process is performed to active the dopants accumulated at the interface to increase the dopant concentration in favorable lattice sites of the source 206 and drain regions 208, thereby improving overall device performance. The laser annealing process may be a dynamic surface annealing (DSA) process that heats the substrate surface only to a predetermined depth, instead of heating the entire thickness of the substrate. The DSA process heats and activates the dopants accumulated at the interface area of the doped source 206 and drain regions 208 to replace atom sites in the crystalline lattice of the silicon layer in the active regions 206, 208 with dopant atoms. Therefore, the crystalline lattice of the silicon opens and incorporates the incoming dopant atoms, thereby improving device conductivity and reducing metal contact resistance.

The DSA process at step 108 may heat and activate the substrate at a predetermined high temperature. In one embodiment, the DSA process activates the dopants in source 206 and drain regions 208 at a temperature between about 1000 degrees Celsius and about 1415 degrees Celsius, such as between about 1050 degrees Celsius and about 1400 degrees Celsius, for example about 1200 degrees Celsius. The substrate is exposed to the laser for various time durations. In one embodiment, a DSA process is performed for less than 500 milliseconds, such as less than 300 milliseconds, for example, less than 100 milliseconds. In one embodiment, the laser emits light with a wavelength selected at about 10.6 μm or about 0.88 μm, although other wavelengths may be utilized. The DSA process may be performed on a DSA platform, available from Applied Materials, Inc., as further depicted in FIG. 3 as below.

In conventional processes, a thermal annealing process for dopant activation, such as the annealing process at step 104, is typically performed after the ion implantation of the source and drain region and prior to the silicidation process to activate the dopants implanted into the devices. In the present invention, the conventional thermal annealing process of step 104 is optional because the laser anneal process of step 108 performed after the silicidation process efficiently activates the dopants in the source and drain regions. Thus, the dopants accumulated at the interface area adjacent the silicide layer are efficiently activated and moved to suitable sites in lattices of the silicon layer, thereby increasing the overall dopant concentration in the active regions 206, 208. Furthermore, the dopant accumulation and peak dopant concentration associated with the snow-plow effect during silicidation process is mitigated, thereby reducing contact resistance of the suicide layer as compared to conventional processes.

For example, in one embodiment, while the optional thermal activation process at step 104 is not performed, the thermal annealing process at step 108 activates the dopants accumulated at the interface area of the silicon and silicide layer, thereby increasing the actived dopant concentration in the reactive regions, 206, 208. The contact resistance is reduced by the increase of the dopant activation concentration. In another embodiment, the optional thermal activation process at step 104 is performed, and the accumulated dopants resulting from the snow-plow effect are reactived and redistributed into a desired position in silicon lattice structure, thereby increasing the overall dopant concentration in the reactive regions 206, 208 in the subsequent laser anneal step 108.

Additionally, a wider temperature range including use of temperatures greater than 900 degrees Celsius, for silicidation processes may be utilized as compared to the conventional low temperature silidation process because the negative effects of snow-plowed dopants are mitigated by the post silicidation activation process.

Figure 3:
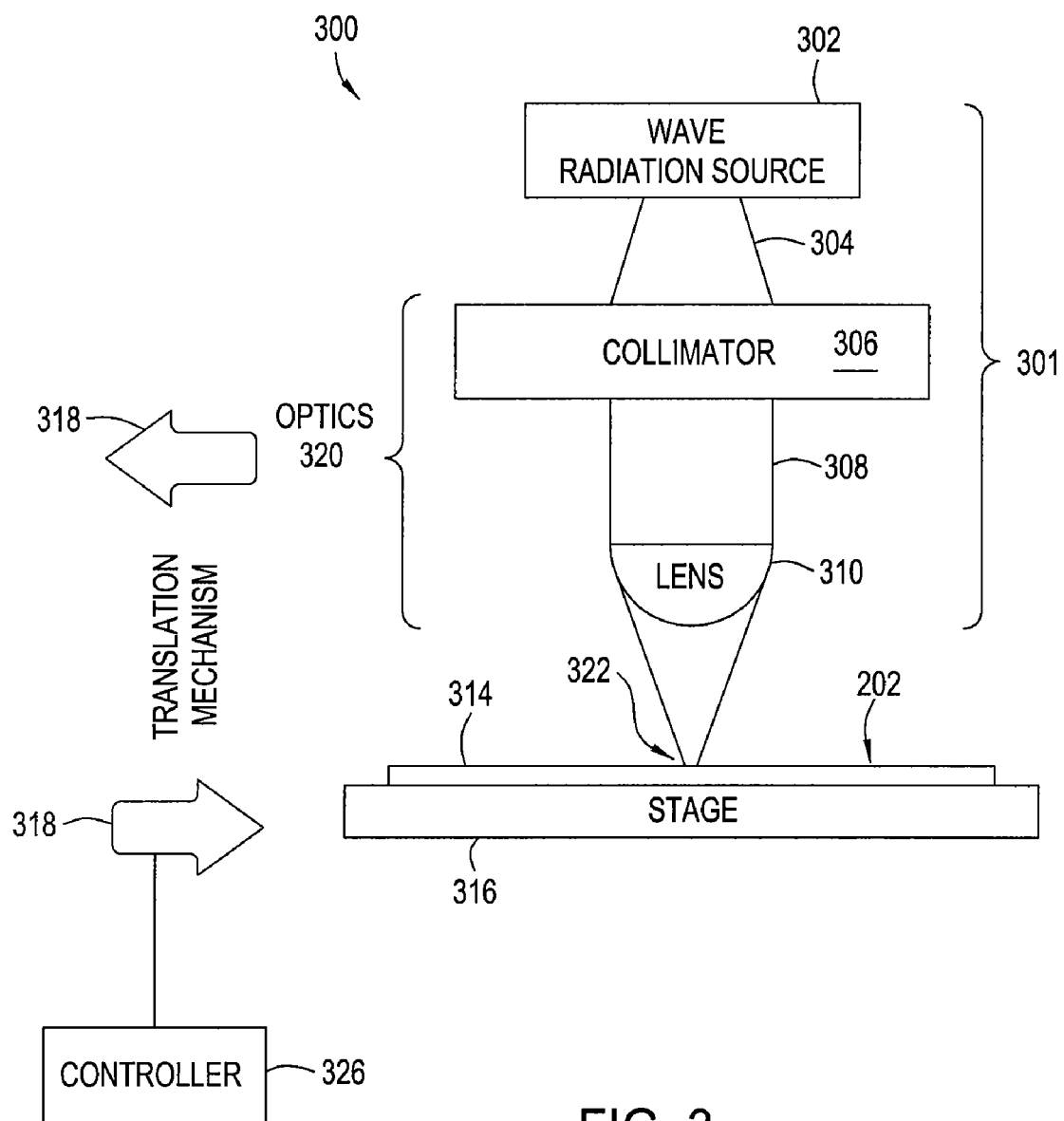
FIG. 3 depicts a diagram of a side view of one embodiment of a laser annealing apparatus that may be utilized to practice the present invention.

FIG. 3 depicts a laser apparatus 300 that may be used to perform the thermal activation process as described at step 108. The apparatus 300 comprises a wave electromagnetic radiation module 301, a stage 316 configured to receive the substrate 202 disposed thereon, and a translation mechanism 318. The wave electromagnetic radiation module 301 comprises a wave electromagnetic radiation source 302 and focusing optics 320 disposed between the wave electromagnetic radiation source 302 and the stage 316.

In one embodiment, the wave electromagnetic radiation source 302 emits a pulse or continuous wave of radiation for at least 15 seconds. In another embodiment, the wave electromagnetic radiation source 302 may include multiple laser diodes, each of which produces uniform and spatially coherent light at the same wavelength. In yet another embodiment, the power of the laser diode/s is in the range of about 0.5 kWatts to 50 kWatts, such as about 2 kWatts. Examples of suitable laser diodes are available from Coherent Inc. of Santa Clara, Calif., Spectra-Physics of California, and Cutting Edge Optronics, Inc. of St. Charles Mo. Another embodiment of a suitable laser diode is available from Spectra Physics' MONSOON® multi-bar module (MBM), which provides about 40-480 watts of continuous wave power per laser diode module.

The focusing optics 320 include one or more collimators 306 to collimate radiation 304 from the wave electromagnetic radiation source 302 into a substantially parallel beam 308. This collimated radiation beam 308 is then focused by at least one lens 310 into a line of radiation 322 directed at an upper surface 314 of the substrate 202.

Lens 310 may be any suitable lens, or series of lenses, capable of focusing radiation into a line or spot. In one embodiment, lens 310 is a cylindrical lens. Alternatively, lens 310 may be one or more concave lenses, convex lenses, plane mirrors, concave mirrors, convex mirrors, refractive lenses, diffractive lenses, Fresnel lenses, gradient index lenses, or the like.

The stage 316 is any platform or chuck capable of securely holding the substrate 202 during transmission, as explained below. In one embodiment, the stage 316 includes a means for grasping the substrate, such as a frictional, gravitational, mechanical, or electrical system. Examples of suitable means for grasping include, mechanical clamps, electrostatic or vacuum chucks, or the like.

The apparatus 300 may include a translation mechanism 318 configured to translate the stage 316 and the line of radiation 322 relative to one another. In one embodiment, the translation mechanism 318 is coupled to the stage 316 to move the stage 316 relative to the wave electromagnetic radiation source 302 and/or the focusing optics 320. In another embodiment, the translation mechanism 318 is coupled to the wave electromagnetic radiation source 302 and/or the focusing optics 320 to move the wave electromagnetic radiation source 302 and/or the focusing optics 320 relative to the stage 316. In yet another embodiment, the translation mechanism 318 moves both the wave electromagnetic radiation source 302 and/or the focusing optics 320, and the stage 316. Any suitable translation mechanism may be used, such as a conveyor system, rack and pinion system, or an x/y actuator, a robot, or other suitable mechanism.

The translation mechanism 318 may be coupled to a controller 326 to control the scan speed at which the stage 316 and the line of radiation 322 move relative to one another. In addition, translation of the stage 316 and the line of radiation 322 relative to one another may be configured to be along a path perpendicular to the line of radiation 322 and parallel to the upper surface 324 of the substrate 202. In one embodiment, the translation mechanism 318 moves at a constant speed, of approximately 2 centimeters per seconds (cm/s) for a 35 micron wide line. In another embodiment, the translation of the stage 316 and the line of radiation 322 relative to one another may be moved with other paths as desired. The laser shown and described with respect to FIG. 3 and other embodiments of lasers that may be used with the embodiments described herein are further described in commonly assigned U.S. patent application Ser. No. 10/126,419, filed Apr. 18, 2002, entitled "Thermal Flux Process by Scanning," which is incorporated by reference herein.

The contact resistance of the resulting structures was measured to evaluate the carrier concentration and activation. The laser annealing process performed after the silicidation process reduced the contact resistance by increasing the dopant concentration in the active regions. For example, doubling the dopant concentration reduced contact resistivity by about 70 percent. Laser annealing reduced the contact resistance through an increase in dopant activation. Additionally, the spreading resistance profiles showed that the carrier concentration increased with the laser anneal temperature throughout the active regions. Thus, laser annealing has demonstrated reduced contact resistance through an increase in dopant activation.

Thus, methods for reducing contact resistance in semiconductor devices are provided in the present invention. The reduced contact resistance is achieved by performing a laser annealing process after silicidation process to efficiently activate dopants accumulated at interface area adjacent a silicide layer in active regions, thereby increasing overall dopant concentration in the devices and advantageously improving device performance.

While the foregoing is directed to embodiments of the present invention, other and further embodiments of the invention may be devised without departing from the basic scope thereof, and the scope thereof is determined by the claims that follow.

The invention claimed is:

1. A method for reducing contact resistance in a semiconductor device, comprising:
providing a substrate having dopants implanted into portions of the substrate;
forming a silicide layer on the dopant implanted portions of the substrate; and
performing a dynamic surface laser anneal on the silicide layer and an interface between the implanted portions of the substrate and the silicide layer to activate at least some of the dopants disposed in the implanted portions immediately after formation of the silicide layer.

2. The method of claim 1, wherein the laser annealing heats the substrate to a temperature between about 1,000 degrees Celsius and about 1,415 degrees Celsius for less than or equal to 500 milliseconds.

3. The method of claim 1, wherein the step of forming the silicide layer further comprises:
thermally annealing a metal layer disposed on the substrate.

4. The method of claim 1, wherein the step of forming a silicide layer further comprises:
thermal activating at least some of the dopants in the semiconductor structure prior to forming the silicide layer.

5. The method of claim 4, wherein the step of the thermal activating the dopants further comprises:
thermal activating the dopants by a rapid annealing process.

6. The method of claim 4, wherein the step the thermal activating the dopants further comprises:
scanning the substrate with a laser.

7. The method of claim 1, wherein the silicide layer is formed by a thermal annealing process that includes at least one of a rapid thermal annealing process or a laser annealing process.

8. A method for reducing contact resistance in a semiconductor device, comprising:
providing a substrate having a semiconductor device formed thereon, wherein the device has source and drain regions and a gate structure;
performing a silicidation process on the substrate by a thermal annealing process; and
performing a dynamically surface laser anneal process to anneal an interface of the source and drain regions adjacent to the gate structure immediately after the silicidation process is completed.

9. The method of claim 8, further comprising:
performing a thermal activation process to the substrate prior to the silicidation process.

10. The method of claim 9, wherein the step of performing the thermal activation process utilizes a rapid annealing process.

11. The method of claim 9, wherein the step of performing the thermal activation process further comprises:
scanning the substrate with a laser.

12. The method of claim 8, further comprises:
activating at least some dopants implanted in the semiconductor device.

13. The method of claim 8, wherein the laser annealing process is performed at a temperature between about 1,000 degrees Celsius and about 1,415 degrees Celsius.

14. The method of claim 8, wherein the laser annealing process is performed for about 500 milliseconds or less.

15. The method of claim 8, wherein the step of performing the silicidation process, further comprises:
depositing a metal layer on the substrate; and
forming a metal silicide layer on the substrate by the thermal annealing process.

16. The method of claim 15, wherein the metal layer is selected from a group consisting of tungsten (W), titanium (Ti), hafnium (Hf), cobalt (Co), nickel (Ni), alloys thereof, and combination thereof.

17. The method of claim 15, wherein the metal layer is deposited by a PVD process.

18. The method of claim 8, wherein the thermal annealing process used to perform the silicidation process is at least one of a rapid thermal annealing process or a laser annealing process.

19. A method for reducing contact resistance in a semiconductor device, comprising:
  providing a substrate having a semiconductor device formed thereon, wherein the device has source and drain regions and a gate structure;
  depositing a metal layer on the device;
  performing a silicidation process to form a silicide layer on the substrate by a thermal annealing process; and
  performing a dynamic surface laser anneal process on an interface of the source and drain regions below the silicide layer immediately after formation of the silicide layer.

20. The method of claim 19, further comprises:
  activating at least some of the dopants implanted in the device by the laser anneal process.

21. The method of claim 20, wherein the dopant is selected from the group consisting of boron, phosphorous, arsenic and combinations thereof.

22. The method of claim 19, wherein the step of depositing the metal layer further comprises:
  performing a thermal activation process prior to depositing the metal layer.

23. The method of claim 19, wherein the laser annealing process heats the source and drain regions to a temperature between about 1,000 degrees Celsius and about 1,415 degrees Celsius for about 500 milliseconds or less.

24. The method of claim 19, wherein the thermal annealing process used to perform the silicidation process is at least one of a rapid thermal annealing process or a laser annealing process.

* * * * *

UNITED STATES PATENT AND TRADEMARK OFFICE
CERTIFICATE OF CORRECTION

PATENT NO. : 7,795,124 B2
APPLICATION NO. : 11/426135
DATED : September 14, 2010
INVENTOR(S) : Nouri et al.

Page 1 of 1

It is certified that error appears in the above-identified patent and that said Letters Patent is hereby corrected as shown below:

Title page item (56), in the References Cited:

Please delete "8,897,118 5/2005 Poon et al." and insert --6,897,118 5/2005 Poon et al.-- therefor;

In the Detailed Description of the Invention:

Column 6, Line 4, please delete "suicide" and insert --silicide-- therefor.

Signed and Sealed this
Twenty-eighth Day of December, 2010

David J. Kappos
*Director of the United States Patent and Trademark Office*